United States Patent [19]

Liauh

[11] Patent Number: 5,027,185

[45] Date of Patent: Jun. 25, 1991

[54] POLYCIDE GATE FET WITH SALICIDE

[75] Inventor: Her-Rern Liauh, Hsin-Chu Hsien, Taiwan

[73] Assignee: Industrial Technology Research Institute, Taiwan

[21] Appl. No.: 503,136

[22] Filed: Mar. 30, 1990

Related U.S. Application Data

[63] Continuation of Ser. No. 202,374, Jun. 6, 1988, abandoned.

[51] Int. Cl.⁵ .................... H01L 29/04; H01L 23/48; H01L 29/46; H01L 29/06
[52] U.S. Cl. ........................................ 357/59; 357/67; 357/71; 357/23.9
[58] Field of Search ................. 357/59 I, 67 S, 71 S, 357/23.9

[56] References Cited

U.S. PATENT DOCUMENTS 4,180,596  12/1979  Crowder et al. .................. 357/59 I
4,622,735  11/1986  Shibata .............................. 357/71 S

OTHER PUBLICATIONS

C. Y. Ting, "Silicide for Contacts and Interconnects", *IEDM*, 1984, pp. 110-113.

Huang et al., "Eliminating Spacer-Induced Degradations in LDD Transistors", *International Symposium on VLSI Technology Systems and Application*, May 13, 1987, Taipei, Taiwan, R.O.C., p. 260-264.

S. M. Sze, *VLSI Technology*, Bell Lab., Incorporated, Murray Hill, N.J., 1983, published by McGraw-Hill Book Company, pp. 367-369.

*Primary Examiner*—Mark Prenty
*Attorney, Agent, or Firm*—Cahill, Sutton & Thomas

[57] ABSTRACT

A process for forming a field-effect-transistor structure upon a silicon substrate includes the steps of sequentially depositing a polysilicon layer and a refractory metal silicide layer over a gate oxide and heating the same to form a polycide gate structure. After etching the polycide composite layer to define the gate, spacer oxide layers are formed to cover the lateral edges of the gate structure, and a transition metal layer is deposited over the bare polycide composite layer and the surrounding bare source and drain diffused silicon regions. The deposited transition metal layer is annealed to react with the polycide in the gate structure and thereby lower the sheet resistance of the gate. The transition metal also reacts with the source and drain regions to form silicides for lowering the sheet resistance of the source and drain regions. Unreacted transition metal is removed from the upper surface of the substrate, and subsequent glass deposition, contact opening, and metalization may be performed in the usual manner.

13 Claims, 2 Drawing Sheets

POLYCIDE GATE FET WITH SALICIDE

This application is a continuation of application Ser. No. 07/202374 filed June 6, 1988 and now abandoned.

BACKGROUND OF THE INVENTION

1. Field of the Invention

The present invention relates generally to processes for forming field-effect-transistors within integrated circuits, and more particularly, to a process for forming a field-effect-transistor having a polycide gate structure including a transition metal salicide to reduce sheet resistance of the gate, and having transition metal silicides formed in the source and drain regions to minimize the sheet resistance thereof.

2. Description of the Prior Art

Large scale integrated circuits (LSI) and very large scale integrated circuits (VLSI) often include a large number of field-effect-transistors fabricated upon a single monolithic semiconductor substrate typically formed of single-crystal silicon. Such field-effect transistors are typically formed to have the smallest dimensions permitted by semiconductor processing technology in order to provide as many transistors as possible into a given area on the upper surface of the semiconductor substrate. However, as the physical size of the field-effect-transistors becomes smaller to achieve higher packing densities, the sheet resistances associated with the gate and with the source and drain of each such transistor typically increase. Increased sheet resistance results in decreased signal transmission speeds through the various transistors within the integrated circuit. Consequently, reductions in the sheet resistance associated with the gate and with the source and drain of such field-effect-transistors help increase the signal transmission speed of the integrated circuit.

Another problem which arises from the reduction in the physical size of transistors formed within an integrated circuit is increased contact resistance at the contacts between the gate, source and drain regions of each transistor and the patterned interconnect metalization layer. Interconnecting metalization is typically isolated from the underlying silicon substrate by a glass passivation layer. Contact openings are formed in the insulating glass layer through which the interconnecting metalization makes contact to the gate, source and drain regions of each transistor. As the geometry of each such transistor becomes smaller, the dimensions of such contact openings must also necessarily become smaller. The contact resistance associated with each contact opening is inversely proportional to the contact area. Hence, reduction in the size of such contact openings typically increases the resistance associated with each such contact; higher contact resistance again results in slower signal transmission speeds through the integrated circuit.

Yet another problem encountered in the manufacture of large scale and very large scale integrated circuits is the phenomenon of junction spiking. Spiking occurs when aluminum from the interconnecting metalization layer diffuses into the source or drain silicon regions and penetrates the p-n junction interface between the source or drain diffusion region and the underlying substrate. Such spiking can result in a short circuit between the source or drain contact and the substrate, and produce corresponding circuit failure. Large scale and very large scale integrated circuits require the use of relatively shallow source and drain diffusion regions in order to utilize small device dimensions; accordingly, aluminum atoms may more easily penetrate such shallower junctions to produce a spike at the p-n junction interface.

Two field-effect-transistor integrated circuit processes which are currently used by semiconductor product manufacturers are the polycide gate process using a shallow junction silicide contact, and the polysilicon gate process with salicide. These two processes are described below with reference to FIGS. 7 and 8, respectively.

Prior art FIG. 7 shows the field-effect-transistor structure resulting from the use of the polycide gate process described by Ting in "Silicide For Contacts And Interconnects", IEDM, 1984, pp. 110–113, the disclosure of which is incorporated herein by reference. The isolating field oxide 2 and the thin gate oxide 5 are formed upon the upper surface of the silicon substrate 1 in the conventional manner. A layer of polysilicon 6 is deposited upon the upper surface of substrate 1, followed by the deposition of a layer of a refractory metal silicide such as molybdenum di-silicide ($MoSi_2$), tungsten di-silicide ($WSi_2$), tantalum di-silicide ($TaSi_2$) or titanium di-silicide ($TiSi_2$). A high temperature cycle for silicide homogenization is then performed to form a composite polycide layer. The polycide layer is patterned by a dry etch process to remove the polycide film except above the gate region of the field-effect-transistor. The formation of polycide in the gate structure reduces the sheet resistance of the gate as compared with the use of polysilicon alone. Source and drain ion implantation and drive-in cycles are then performed in a conventional manner to form source and drain regions 3. Following the deposit of glass passivation layer 4 and formation of contact openings, a transition metal silicide, such as titanium di-silicide ($TiSi_2$), platinum silicide (PtSi), di-palladium silicide ($Pd_2Si$), cobalt di-silicide ($CoSi_2$) or nickel di-silicide ($NiSi_2$), may then be deposited through the contact openings to form shallow junction silicide regions (8, 9) to reduce the contact resistance associated with the underlying polycide gate and the underlying silicon source and drain regions. A barrier metal (10), such as titanium tungsten (TiW) or titanium nitride (TiN) is then applied to prevent the subsequent layer of aluminum interconnect metalization (11) from migrating into the silicon source and drain regions (3) and causing junction spiking.

In practice, the above-described polycide gate process achieves some reduction in the gate sheet resistance as compared with a polysilicon gate structure. However, the polycide gate process using shallow junction silicide contacts over the source and drain regions does not significantly reduce the sheet resistance of the source and drain regions.

A field-effect-transistor structure made from the above-mentioned polysilicon gate process with salicide is shown in prior art FIG. 8. This process is also described in the aforementioned technical paper by Ting. The isolating field oxide 2 and thin gate oxide 5 are formed upon the upper surface of substrate 1 in a conventional manner. A layer of polysilicon 6 is deposited upon the upper surface of substrate 1 and is then patterned to form the gate. Source and drain regions 3 are formed by conventional ion implantation and drive-in processes. Oxide side wall spacers (not shown in FIG. 8) are then formed upon the lateral edges of the polysilicon gate, leaving the upper surface of the polysilicon gate and the upper surfaces of the source and drain regions 3 bare. A thin layer of a transition metal, such as Ti, Pt, Co, or Ni, is then deposited on the upper surface of substrate covering the bare source and drain regions 3 and the bare upper surface of polysilicon gate 6. The transition metal layer is then heated to form metal silicides (such as $TiSi_2$) at both the polysilicon gate and the silicon source and drain diffusion areas. Unreacted transition metal is removed by a selective etch. A passivation layer 4 is applied in a conventional manner, after which contact openings are formed. A barrier metal layer 10 and overlying aluminum-silicon interconnection metal layer 11 are then deposited and patterned in a conventional manner.

The above-described polysilicon gate process with salicide serves to significantly lower the sheet resistance associated with the source and drain regions through formation of a silicide region 8 which extends almost entirely across the source and drain regions 3. The formation of the extensive silicide regions 8 within the source and drain regions additionally reduces the risk of junction spiking. Formation of silicide layer 12 upon the upper surface of polysilicon gate 6 somewhat reduces the sheet resistance associated with the gate, but the resulting gate sheet resistance is still relatively high as compared with the sheet resistance of the above-described polycide gate structure.

Accordingly, it is an object of the present invention to provide a process for forming field-effect-transistors in integrated circuits wherein the sheet resistance associated with the gate of such transistors is relatively low in order to maximize signal transmission speeds.

It is another object of the present invention to provide such a process which can retain the relatively low sheet resistance of the source and drain regions obtained through use of the above-described polysilicon gate process with salicide.

It is still another object of the present invention to provide such a process which achieves lower gate sheet resistances than either the above-described polycide gate process or the above-described polysilicon gate process with salicide.

It is a further object of the present invention to provide such a process which minimizes the occurrence of junction spiking and contact resistance in shallow junction field-effect-transistors.

It is a still further object of the present invention to provide such a process that is compatible with LSI and VLSI fabrication technologies and fabrication apparatus that are commercially available.

It is yet another object of the present invention to provide such a process which is relatively simple and convenient to perform.

It is a further object of the present invention to provide a field-effect-transistor structure resulting from the practice of such a process.

SUMMARY OF THE INVENTION

Briefly described and in accordance with a preferred embodiment thereof, the present invention relates to a field-effect-transistor structure having a polycide gate with salicide, and the process for forming the same. After forming isolating field oxide and gate oxide layers upon the upper surface of a semiconductor substrate, a layer of polysilicon is deposited upon the upper surface of the substrate overlying the gate oxide. A layer of refractory metal silicide is then deposited over the polysilicon layer and is heated to homogenize the silicide layer and to form a polycide composite layer. The polycide composite layer is then patterned to define the lateral edges of the gate structure. For lightly-doped-drain (LDD) structures, source and drain N$^-$ regions may then be formed in the single-crystal substrate adjacent the upper surface thereof on opposing sides of the gate structure, as by ion implantation and subsequent thermal drive-in. Following formation of spacer oxide layers along the lateral edges of the gate structure, N$^+$ and/or P$^+$ dopant ion implantation and drive-in cycles are performed in a conventional manner to form source and drain regions. Then, a layer of a transition metal, such as Ti, Pt, Co, Ni, or Pd, is deposited upon the upper surface of the substrate overlying the upper surface of the polycide gate structure and overlying the source and drain regions. The deposited layer of transition metal is annealed to react with the underlying polycide composite layer in the gate structure, and to react with the single-crystal silicon in the source and drain regions to form transition metal silicide layers (salicide) therein. The composite transition metal/refractory metal silicide (polycide) formed upon the upper surface of the gate structure reduces the effective sheet resistance of the gate structure below that of a conventional polycide gate structure. Moreover, the transition metal silicide layers formed across the source and drain regions significantly reduce the sheet resistance associated with the source and drain.

A passivating glass layer may then be deposited upon the upper surface of the substrate, followed by contact opening formation in the conventional manner. A barrier metal layer and a subsequent aluminum-silicon interconnect metalization layer may then deposited and patterned to make desired connections to the source, drain and gate of the resulting field-effect-transistor structure.

The aforementioned deposited layer of polysilicon is preferably in the range of approximately 1300 to 2500 angstroms thick prior to the deposition of the overlying refractory metal silicide layer. The deposited layer of refractory metal silicide is preferably in the range of 1500 to 3000 angstroms thick before being homogenized. The refractory metal silicide is initially deposited as a molten material consisting of $WSi_x$, $TaSi_x$, $TiSi_x$, or $MoSi_x$, wherein x is greater than or equal to 2. Subsequent silicide homogenization converts such molten silicides to $WSi_2$, $TaSi_2$, $TiSi_2$, and $MoSi_2$, respectively.

The transition metal deposited following formation of the spacer oxide layers is preferably deposited with an initial thickness in the range of approximately 300 to 700 angstroms prior to annealing. The transition metal is an element selected from the group consisting of Ti, Pt, Co, Ni, and Pd.

BRIEF DESCRIPTION OF THE DRAWINGS

FIG. 1 is a cross section of a semiconductor single-crystal substrate upon the upper surface of which an isolating field oxide and a thin gate oxide layer are formed, and in which source and drain diffused regions are formed, and upon which a polycide gate structure is defined.

FIG. 2 shows the structure of FIG. 1 following deposition of a transition metal layer upon the upper surface thereof.

FIG. 3 shows the structure of FIG. 2 following an annealing process wherein the transition metal reacts with and combines with the polycide gate and with the source and drain regions.

FIG. 4 shows the structure of FIG. 3 following removal of the unreacted portion of the transition metal layer.

FIG. 5 shows the structure of FIG. 4 following deposition of a glass passivation layer upon the upper surface thereof.

FIG. 6 shows the structure of FIG. 5 following formation of contact openings, deposition of barrier metal and aluminum-silicon metalization layers, and following the patterning of such metalization layers.

DETAILED DESCRIPTION OF THE PREFERRED EMBODIMENTS

Figure 1:
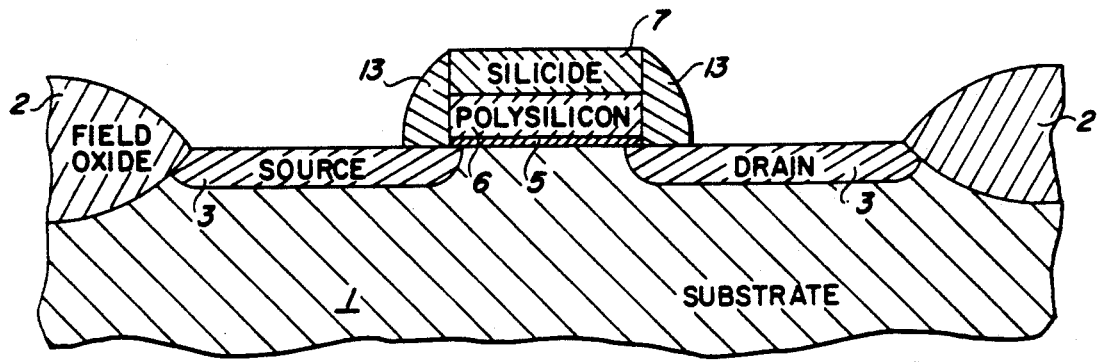
FIGS. 1-6 generally demonstrate a sequence of processing steps for forming a field-effect-transistor structure having a polycide gate with salicide in accordance with the teachings of the present invention.

In FIG. 1, a semiconductor substrate made of single crystal silicon is designated by reference numeral 1. Those skilled in the art will appreciate that substrate 1 is typically in the form of a thin, flat polished semiconductor wafer. In the preferred embodiment, silicon substrate 1 is a lightly doped P− type silicon substrate having a resistivity of 40 to 60 ohms-centimeter. Within FIG. 1, the areas designated by reference numeral 2 represent a field oxide formed upon the upper surface of substrate 1 by heating the substrate in an oxygen ambient. Field oxide 2 serves to isolate the transistor structure shown in FIG. 1 from other similar transistor structures formed elsewhere upon substrate 1. Formed upon the upper surface of substrate 1 in FIG. 1 is a relatively thin insulating gate oxide layer 5, the thickness of which depends upon the dimensions of the transistor structure. Gate oxide layer 5 is also formed by heating substrate 1 in an oxygen ambient to form silicon dioxide upon the upper surface of the single-crystal silicon substrate 1.

Following formation of gate oxide layer 5, a layer of polysilicon is deposited upon the upper surface of substrate 1. Preferably, the thickness of the initially deposited layer of polysilicon 6 is approximately 1300 to 2500 angstroms, and is doped by $POCl_3$ to produce an initial sheet resistance in the range of approximately 13 to 30 ohms per square, as measured upon an associated control wafer. Following deposition of the polysilicon layer 6, substrate 1 is subjected to a de-glass process for removing any oxide covering the upper surface of the polysilicon layer 6. A refractory metal silicide, preferably chosen from the group consisting of $WSi_x$, $TaSi_x$, $TiSi_x$ and $MoSi_x$, is deposited as a layer 7 upon polysilicon layer 6. The silicide layer 7 is deposited to an initial thickness of approximately 1500 to 3000 angstroms. Methods of depositing and forming such a silicide layer are known to those skilled in the art, and are described in the above-mentioned paper by Ting. Those skilled in the art will appreciate that silicide layer 7 is initially deposited as a molten compound rather than as a molecular unit. The expression "$WSi_x$" simply indicates that the tungsten and silicon atoms are mixed with each other in a relative ratio of 1:X, wherein X ranges from 2.0 to approximately 2.8. After homogenization, the tungsten and silicon combine to form $WSi_2$.

Following deposition of silicide layer 7, substrate 1 is heated to homogenize silicide layer 7 and to form a composite polycide layer. The composite polycide layer (6/7) is then defined, using a dry etching process, to remove the polycide from the surface of substrate 1 except over the central area that is to serve as the gate. The lateral edge profile of the composite polycide layer is vertical to the plane of substrate 1.

Still referring to FIG. 1, a layer of oxide is deposited upon the upper surface of substrate 1 to a thickness of approximately 2500 to 3500 angstroms by a chemical vapor deposition (CVD) process. The resulting oxide layer is then etched by the method of reactive ion etch (RIE), an anisotropic etch process. The only portions of the spacer oxide layer which are not etched away are those portions designated within FIG. 1 by reference numerals 13 bordering the lateral edges of the composite polycide gate structure. Oxide spacer layers 13 facilitate the subsequent formation of a salicide structure. Source and drain regions 3 may next be formed using known ion implantation and thermal drive-in processes. For PMOS integrated circuits, the implanted P+ dopant ion may be $BF_2$. For NMOS integrated circuits, the N+ implanted dopant ion may be As. Moreover, for lightly-doped drain (LDD) NMOS integrated circuits, an N− dopant, such as phosphorus, can be implanted before formation of spacer oxide layers 13, and before implantation of the N+/P+ dopant ions. For double-diffused drain (DDD) NMOS integrated circuits, both the less heavily doped N− dopant and the more heavily doped N+/P+ dopant can be implanted and driven in following formation of the side wall oxide spacer layers 13.

Figure 2:
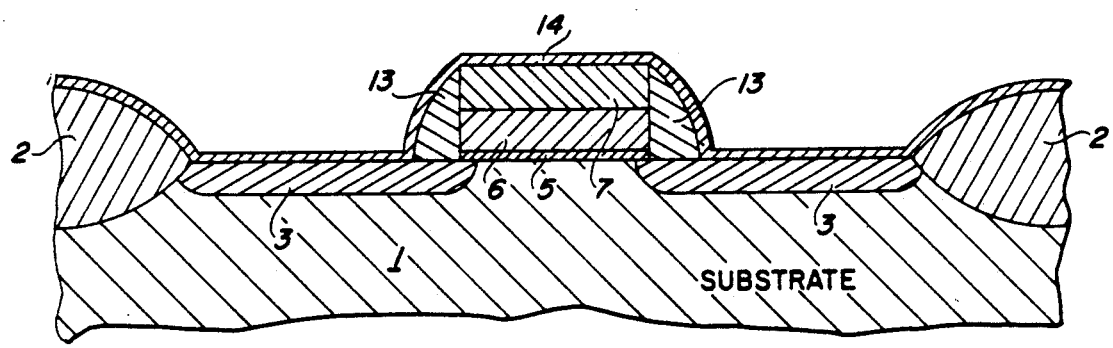

Turning to FIG. 2, a layer of a transition metal such as titanium (Ti), platinum (Pt), cobalt (Co), nickel (Ni), or palladium (Pd), is deposited upon the upper surface of substrate 1, and is designated within FIG. 2 by reference numeral 14. Transition metal layer 14 is initially deposited to a thickness of approximately 300 to 700 angstroms and should be in intimate contact with the bare upper surface of polycide composite layer 6/7, and in intimate contact with the bare source and drain regions 3. Accordingly, the upper surfaces of polycide composite layer 6/7 and the upper surfaces of source and drain regions 3 are thoroughly cleaned of all oxide or other particles prior to deposition of transition metal layer 14.

Figure 3:
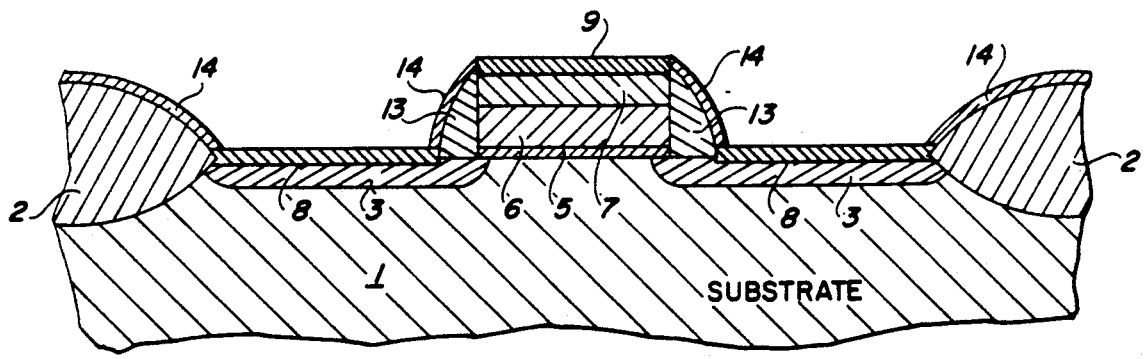

Within FIG. 3, the field-effect-transistor structure is shown following an annealing process which causes the transition metal 14 to react with the bare source and drain regions 3 to form a silicide layer 8, and to react with the bare polycide surface to form a transition metal/refractory metal silicide (polycide) compound layer 9. The annealing condition is chosen to be compatible with the particular transition metal selected. For example, assuming that platinum (Pt) is selected as the transition metal, then the annealing process is carried out at 590° C. for 30 minutes in a nitrogen gas ($N_2$) ambient. Again assuming that platinum is selected as the transition metal layer 14, then the silicide layers 8 are each comprised of platinum silicide (PtSi). Again assuming that platinum is selected as the transition metal 14, and further assuming that silicide layer 7 of the polycide gate structure is formed from tungsten silicide ($WSi_x$), then composite layer 9 is formed by the compound $Pt_1W_mSi_n$, wherein 1, m and n are each greater than 0 and indicate the relative ratios of such elements in combination with one another.

During the annealing process mentioned in the preceding paragraph, the transition metal layer 14 will not react with either the field oxide regions 2 or the chemical vapor deposited spacer oxide layers 13. The unreacted transition metal layer 14 is shown in FIG. 3.

Figure 4:
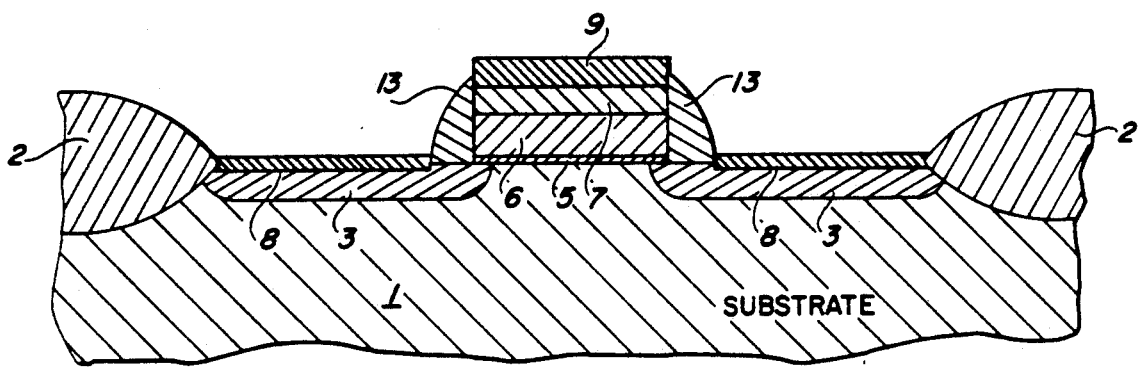

Referring to FIGS. 3 and 4, the unreacted transition metal layer 14 is removed by a chemical etch solution without etching away the silicide layers 8 and 9. Such a chemical solution etchant is a selective wet etchant, and in the case wherein the transition metal layer 14 is formed of platinum (Pt), then the selective etchant is aqua-regia; the aqua-regia etchant is maintained in contact with the semiconductor wafer for approximately 1½ minutes at a temperature of approximately 85° C.

Figure 5:
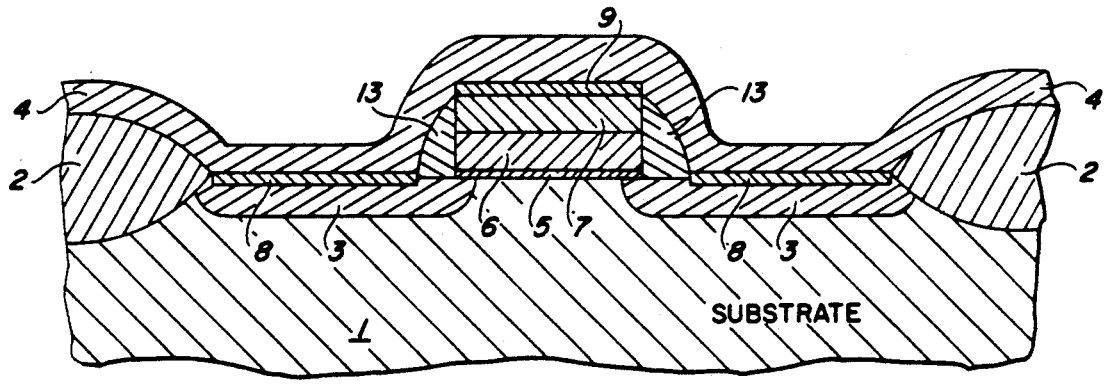

Referring to FIG. 5, the next step in the process is to form a doped silicon oxide glass passivation layer 4 over the entire upper surface of the wafer by the chemical vapor deposition (CVD). Glass passivation layer 4 may be doped with phosphorous (so-called PSG) or with both boron and phosphorous (so-called BPSG). Glass passivation layer 4 is reflowed at a suitably high temperature to eliminate any steps to provide a smooth and continuous surface for receiving subsequent deposition of aluminum-silicon interconnecting metalizaton. The particular reflow temperature depends upon the materials used to form the polycide and the selection of the transition metal; by way of example, if the composite polycide gate structure is formed using a silicide layer of $WSi_2$, and the transition metal layer 14 is platinum, then the reflow temperature would be selected to be in the range of approximately 700° C. to 800° C.

Figure 6:
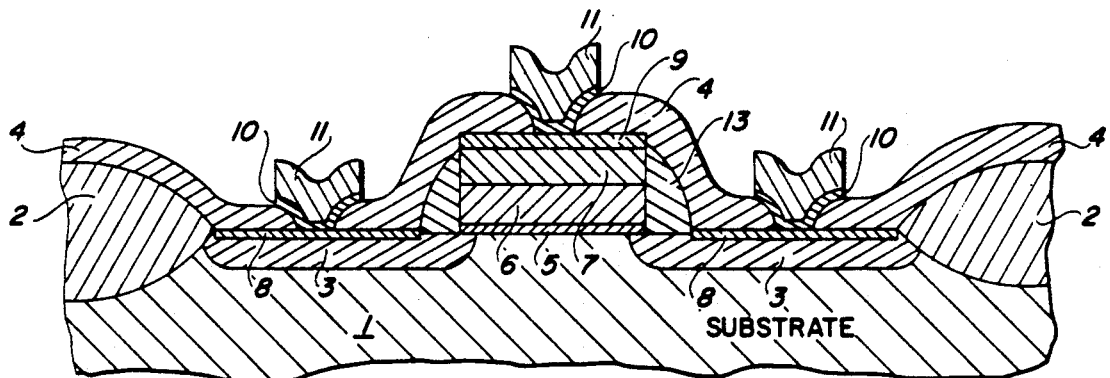

Turning to FIG. 6, contact openings are formed in glass passivation layer 4 above the source and drain regions 3, and above the polycide gate structure, by the same methods conventionally used in the manufacture of integrated circuits, i.e., through the application of a photoresist coating that is selectively exposed through aligned masks, development of the photoresist coating, and selective etching through the patterned photoresist. Following removal of the photoresist, a layer of a barrier metal 10 such as titanium tungsten (TiW) or titanium nitride (TiN) is deposited upon the upper surface of the wafer to minimize the risk of aluminum migration into the silicon substrate, thereby minimizing opportunities for junction spiking. Typical thickness of the barrier metal layer 10 is from approximately 1000 to 2000 angstroms thick. Following deposition of the barrier metal layer 10, the aluminum-silicon (AlSi) interconnect metalization layer 11 is deposited upon the upper surface of the wafer. Interconnect metalization layer 11 is composed of aluminum to which 1% silicon has been added. Interconnect metalization layer 11 is deposited to a thickness of approximately 6000 to 10000 angstroms.

Following deposition of the interconnect metalization layer 11, the composite barrier metal layer 10 and interconnect metal layer 11 are patterned using the same methods that are conventionally used by manufacturers of integrated circuits. Briefly, the method of patterning the metal layers includes covering the upper surface of the wafer with photo-resist, exposing the photo-resist through an aligned mask, developing the exposed photo-resist coating and removing the unexposed portions thereof, and removing the portions of the metal layers unprotected by photo-resist by a dry etching process. The remaining photo-resist is then removed, leaving the desired metalization pattern therebelow, as shown in FIG. 6.

Figure 7:
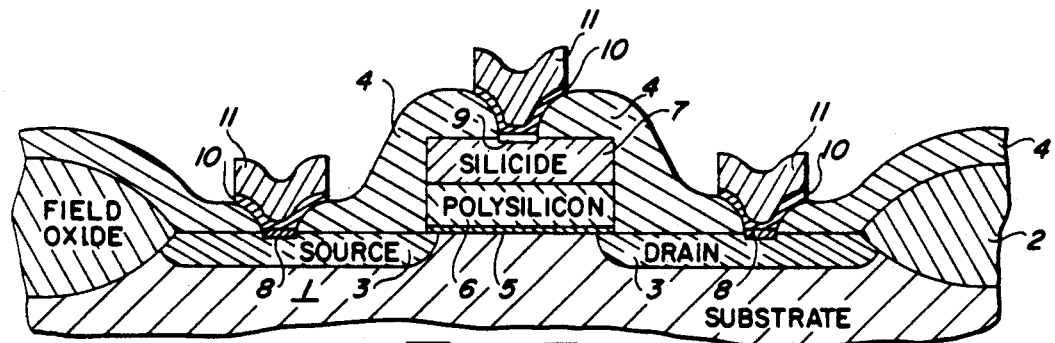
FIG. 7 is a cross section of a field-effect-transistor structure made according to a polycide gate process known in the prior art.
Figure 8:
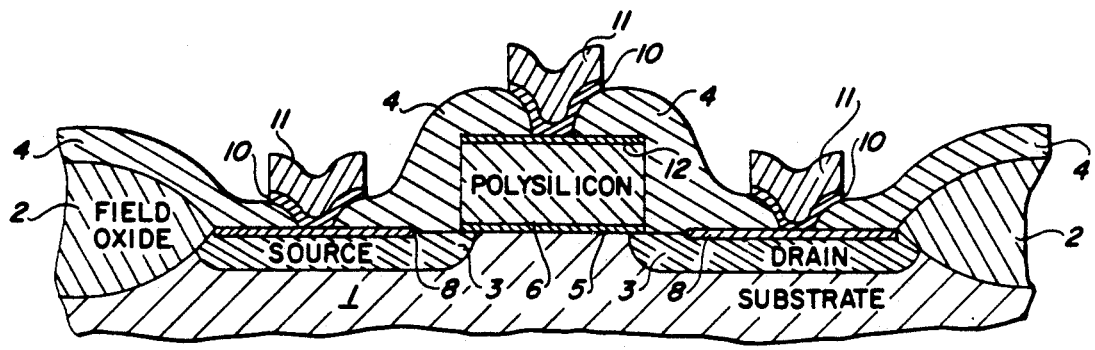
FIG. 8 is a cross section of a field-effect-transistor structure made by a polysilicon gate process with salicide known in the prior art.

Comparing the completed field-effect-transistor structure of the present invention as shown in FIG. 6 to the prior art polysilicon gate structure shown in FIG. 8, the source and drain regions thereof are similar. In each case, the silicide layer 8 formed over source and drain regions 3 is approximately 400 to 800 angstroms thick, and extends for almost the full area of such source and drain regions; accordingly, silicide layers 8 serve to significantly reduce the sheet resistance of such source and drain regions, while further minimizing the opportunities for junction spiking. Comparing the gate structure of the field-effect-transistor structure shown in FIG. 6 to the gate structures shown in prior art FIGS. 7 and 8, the polycide gate structure with salicide of FIG. 6 exhibits a gate sheet resistance lower than the gate sheet resistance of either of the prior art devices shown in FIG. 7 or 8.

EXAMPLE

A single-crystal silicon substrate wafer was selected having a p− dopant corresponding to a resistivity of 40 to 60 ohms-centimeter. The n+ junction depth for the source and drain regions of NMOS devices was approximately 0.27 micrometers, and the p+ junction depth for the source and drain regions of PMOS devices was approximately 0.3 micrometers. The gate oxide was selected to be 250 angstroms thick. Polysilicon layer 6 was deposited to a thickness of approximately 2500 angstroms with an initial sheet resistance of 30 ohms per square as measured upon a control wafer. Silicide layer 7 was formed by depositing molten tungsten-silicide ($WSi_x$) by chemical vapor deposition to an initial thickness of approximately 2000 angstroms. The transition metal layer 14 (see FIG. 2) was selected to be platinum, and unreacted platinum was removed using aqua-regia as the selective etchant. Platinum silicide (PtSi) layers formed upon source and drain regions 3 to a thickness of approximately 700 angstroms, while a layer of platinum/tungsten silicide ($Pt_1W_mSi_n$), or polycide, formed upon the upper surface of the composite polycide gate to a thickness of approximately 700 angstroms. A barrier metal layer 10 of titanium tungsten was applied to a thickness of approximately 100 angstroms, and an interconnect metal layer 11 of aluminum with 1% silicon was applied thereover. Measurements were made of the resulting NMOS and PMOS field-effect-transistor structures and compared with similar measurements made for the structures shown in prior art FIGS. 7 and 8. The comparative measurements are set forth in Table 1 below:

TABLE 1

| Nature of Structure | Conventional Field-Effect Transistor Structures | | Preferred Embodiment of the present invention Polycide Gate FET with salicide FIG. 6 |
|---|---|---|---|
| | Polycide Gate FET with shallow junction PtSi contact FIG. 7 | PtSi Salicide FET FIG. 8 | |
| Thickness of Polysilicon | 2500 Å | 4800 Å | 2500 Å |
| Thickness of WSi Silicide | 2000 Å | — | 2000 Å |
| Thickness of PtSi Silicide | 700 Å | 700 Å | 700 Å |
| Sheet resistance of gate | 3.71 Ω/ | 5.65 Ω/ | 2.18 Ω/ |
| Sheet resistance of source/ drain region N+(P+) | 47.6 Ω/ (90.6 Ω/ ) | 5.04 Ω/ (5.11 Ω/ ) | 5.03 Ω/ (5.02 Ω/ ) |

As shown in the above table, a conventional polycide gate FET structure using a shallow junction platinum silicide contact, as shown in prior art FIG. 7, was constructed using the same 2500 angstrom thickness of polysilicon and the same 2000 angstrom thickness of tungsten silicide as was used in making the FET structure of the present invention. The thickness of the platinum silicide shallow junction contact applied to the conventional polycide gate structure shown in FIG. 7 was 700 angstroms, identical to the platinum silicide region thicknesses formed according to the process of the present invention, as shown in FIG. 6. Nonetheless, it will be noted that the sheet resistance of the gate of the FET constructed according to the present invention was only 2.18 ohms per square (Ω/ ), whereas the corresponding sheet resistance of the gate for the conventional polycide gate FET structure was 3.71 ohms per square (Ω/ ).

As is also reflected in Table 1 set forth above, a conventional PtSi salicide structure was formed using a 4800 angstrom polysilicon thickness and a overlying platinum metal thickness of 700 angstroms. The resulting sheet resistance of the gate structure for the conventional PtSi salicide FET structure was 5.65 ohms per square (Ω/ ). Thus, the FET structure of the present invention has a lower gate sheet resistance than either of the conventional field-effect-transistor structures shown in prior art FIGS. 7 and 8.

Table 1 above also sets forth the resulting sheet resistances of the source and drain regions for NMOS and PMOS FET structures constructed according to the preferred embodiment of the present invention, as well as for the two prior art FET structures shown in FIGS. 7 and 8. As will be noted from Table 1, the sheet resistance of the NMOS and PMOS source and drain regions for the FET structure of the present invention is virtually identical with that for the conventional PtSi salicide FET structure and is reduced significantly from that for the conventional polycide gate FET structure.

Those skilled in the art will now appreciate that FET structures formed in accordance with the process described herein have a gate sheet resistance well below that for corresponding polycide gate FET structures using shallow junction PtSi contacts, while retaining the relatively low source and drain sheet resistances provided by conventional PtSi salicide FET structures. Moreover, the process described herein is no more complicated than processes already known in the art to form the prior art structures shown in FIGS. 7 and 8, as the processing steps used to practice the present invention are already used in one or the other of the two prior art processes described in regard to prior art FIGS. 7 and 8. While the invention has been described with reference to a preferred embodiment thereof, the description is for illustrative purposes only and is not to be construed as limiting the scope of the invention. Various modifications and changes may be made by those skilled in the art without departing from the true spirit and scope of the invention as defined by the appended claims.

I claim:

1. A field-effect-transistor structure having reduced gate sheet resistance and relatively low source and drain sheet resistance, said field effect transistor structure comprising in combination:
   a. a substrate of single-crystal silicon having an upper surface;
   b. source and drain regions formed in said substrate adjacent the upper surface thereof and spaced apart from one another, said source and drain regions each having a sheet resistance associated therewith;
   c. a gate structure formed upon the upper surface of said substrate generally between said source and drain regions, said gate structure including a layer of silicon dioxide formed upon the upper surface of said substrate, and a layer of polycide formed upon said silicon dioxide layer, said polycide layer being a composite of a layer of polysilicon over which a layer of a refractory metal silicide is deposited, said polycide layer having lateral edges, said polycide layer having a sheet resistance associated therewith, said gate structure further including a composite annealed layer of a transition metal formed upon and annealed with said polycide layer to reduce the effective sheet resistance of the polycide layer, said composite annealed layer of a transition metal extending between said lateral edges of said polycide layer and being substantially coextensive with the entire polycide layer; and d. first and second metal silicide layers formed upon said source and drain regions, respectively, each of said first and second metal silicide layers being a composite of a layer of said transition metal formed upon and reacted with said single-crystal silicon at said respective source and drain regions for reducing the effective sheet resistance associated with each of said source and drain regions.

2. A field-effect-transistor structure as recited in claim 1 further including a layer of deposited glass overlying said source and drain regions and overlying said gate structure.

3. A field-effect-transistor structure as recited in claim 2 wherein said layer of deposited glass has contact openings formed therein above said gate structure and above said source and drain regions to facilitate electrical interconnection thereto.

4. A field-effect-transistor structure as recited in claim 3 further including formations of a barrier metal within each of said contact openings.

5. A field-effect-transistor structure as recited in claim 4 further including a patterned layer of aluminum-silicon formed upon said layer of deposited glass and overlying said formations of said barrier metal to make electrical interconnections with said gate structure and with said source and drain regions.

6. A field-effect-transistor structure as recited in claim 1 wherein said source and drain regions comprise regions of said substrate adjacent the upper surface thereof into which a dopant is introduced by ion implantation followed by thermal drive-in of the implanted ions.

7. A field-effect-transistor structure as recited in claim 1 wherein said layer of polysilicon within said gate structure is initially in the range of 1300 to 2500 angstroms thick prior to deposition of said refractory metal silicide layer.

8. A field-effect-transistor structure as recited in claim 7 wherein said layer of refractory metal silicide deposited upon said layer of polysilicon is initially in the range of 1500 to 3000 angstroms thick before combining with said layer of polysilicon to form said polycide layer.

9. A field-effect-transistor structure as recited in claim 1 wherein said refractory metal silicide deposited upon said layer of polysilicon is a molten material selected from the group consisting of $WSi_x$, $TaSi_x$, $TiSi_x$, and $MoSi_x$, and wherein x is greater than or equal to 2.

10. A field-effect-transistor structure as recited in claim 9 wherein said transition metal is an element selected from the group consisting of Ti, Pt, Co, Ni, and Pd.

11. A field-effect-transistor structure as recited in claim 10 wherein the thickness of said transition metal layer deposited upon said polycide layer is initially in the range of 300 to 700 angstroms thick prior to annealing with said polycide layer.

12. A field-effect-transistor structure as recited in claim 1 wherein said transition metal is an element selected from the group consisting of Ti, Pt, Co, Ni, and Pd.

13. A field-effect-transistor structure as recited in claim 1 wherein the thickness of said transition metal layer deposited upon said polycide layer is initially in the range of 300 to 700 angstroms thick prior to annealing with said polycide layer.

* * * * *